(12) United States Patent
Schultz et al.

(10) Patent No.: US 6,295,122 B1
(45) Date of Patent: *Sep. 25, 2001

(54) ILLUMINATION SYSTEM AND REMA OBJECTIVE WITH LENS DISPLACEMENT AND OPERATING PROCESS THEREFOR

(75) Inventors: Jörg Schultz, Aalen; Johannes Wangler, Kongsbronn, both of (DE)

(73) Assignee: Carl Zeiss (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/264,137

(22) Filed: Mar. 5, 1999

(30) Foreign Application Priority Data

Mar. 5, 1998 (DE) .............................. 198 09 395

(51) Int. Cl.⁷ .................................................... G03B 27/54
(52) U.S. Cl. .............................................. 355/67; 355/53
(58) Field of Search ........................ 355/53, 67; 359/648, 359/649, 738

(56) References Cited

U.S. PATENT DOCUMENTS

| | | |
|---|---|---|
| 4,851,882 | 7/1989 | Takahashi et al. . |
| 5,666,206 | 9/1997 | Uchiyama . |
| 5,739,899 | 4/1998 | Nishi et al. . |
| 5,982,558 * | 11/1999 | Furter et al. .......................... 359/649 |
| 6,028,660 * | 2/2000 | Van Der Laan et al. .............. 355/67 |

FOREIGN PATENT DOCUMENTS

| | | | |
|---|---|---|---|
| 0 811 865 A2 | 10/1997 | (EP) | .............................. G02B/19/00 |
| 8-316123 | 11/1996 | (JP) | .............................. H01L/21/027 |

\* cited by examiner

Primary Examiner—Safet Metjahic
Assistant Examiner—E. LeRoux

(57) ABSTRACT

An illumination system for a microlithography projection illumination equipment, in which a secondary light source is imaged on a reticle. The distortion of the image can be set by at least one variable optical path between optical elements, and the uniformity of the illumination is changed because of the changed distortion, in particular, in that the uniformity is increased toward the edge.

24 Claims, 2 Drawing Sheets

ILLUMINATION SYSTEM AND REMA OBJECTIVE WITH LENS DISPLACEMENT AND OPERATING PROCESS THEREFOR

CROSS-REFERENCES TO RELATED APPLICATIONS

Not Applicable.

Statement Regarding Federally sponsored Research or Development

Not applicable.

BACKGROUND OF THE INVENTION

1. Field of the Invention

The invention relates to an illumination system for a microlithographic projection equipment, a REMA objective, and a process for the operation of a REMA objective.

2. Discussion of Relevant Prior Act

An illumination system for a microlithographic projection illumination equipment is known from U.S. Pat. No. 4,851,882, with a simple REMA objective which has a field diaphragm, namely the reticle mask (REMA), on which the reticle with the structured lithographic mask is imaged. A zoom system is provided, mounted in front, in order to insure optimum illumination of the whole REMA diaphragm surface with little loss of light, in the case of reticles with different mask dimensions and correspondingly different aperture measurements of the REMA diaphragm. There are no specific embodiment examples.

Highly developed REMA objectives are described in German Patent Application DE-A 195 48 805 and in the German Patent Application DE 196 53 983.8 of Carl Zeiss. They are suitable for cooperating with zoom-axicon illumination objectives according to European Patent EP-A 0 687 956 of Carl Zeiss, and for an arrangement of the REMA diaphragm at the exit of a glass rod according to U.S. Pat. No. 5,646,715. The cited applications of Carl Zeiss are incorporated by reference into the present application. These all have in common, with the present application, the co-inventor Wangler.

European Patent 0 500 393 B1 describes a microlithographic projection illumination system with variable quadrupole illumination, in which there is provided, between a honeycomb condenser and the reticle mask, an optics with the possibility of adjustment in order to adjust the uniformity of illumination. Since the skilled person is given in this patent only functional optical groups in the nature of block diagrams, but not a specific embodiment example, this disclosure has more of a functional character.

U.S. Pat. No. 5,311,362 describes a microlithographic projection illumination system with variable numerical aperture of the illumination system, in which the numerical aperture of the projection objective is also variable and an optical path length between lenses of the projection objective can be varied in dependence on the two numerical apertures, whereby aberrations, primarily the vertical spherical aberration, are corrected.

In general, various embodiments of projection objectives with adjusting means for the correction of variable imaging errors are known.

SUMMARY OF THE PRESENT INVENTION

The present invention has as its object to improve an illumination system such that optimum uniformity, i.e. regularity of the illumination over the whole surface of the wafer, is attained. This is to hold for the most diverse disturbing influences which can also arise with variable aperture of the illumination as regards numerical aperture and shape of aperture such a circle, ring, or quadrupole.

This object is attained by means of an illumination system in which a secondary light source is imaged on a reticle and distortion of the image of the secondary light source is adjusted by adjusting at least one variable optical path between optical elements or by a REMA objective. This object is also achieved by a REMA objective comprising optical elements, in which the optical path between two optical elements is adjustable. The object of the invention is also achieved by an operating process comprising changing at least one optical path between two optical elements and the REMA objective in dependence on the variable aperture of the illumination system.

For the first time, the distortion of the illumination is thus adjustably provided, and hence control and regulation of the uniformity of the illumination is derived.

Likewise for the first time, adjustment is provided in a REMA objective.

BRIEF DESCRIPTION OF THE DRAWINGS

The invention will be described in more detail with reference to preferred embodiments and to the accompanying drawings, in which.

DETAILED DESCRIPTION OF PREFERRED EMBODIMENTS

Figure 1:
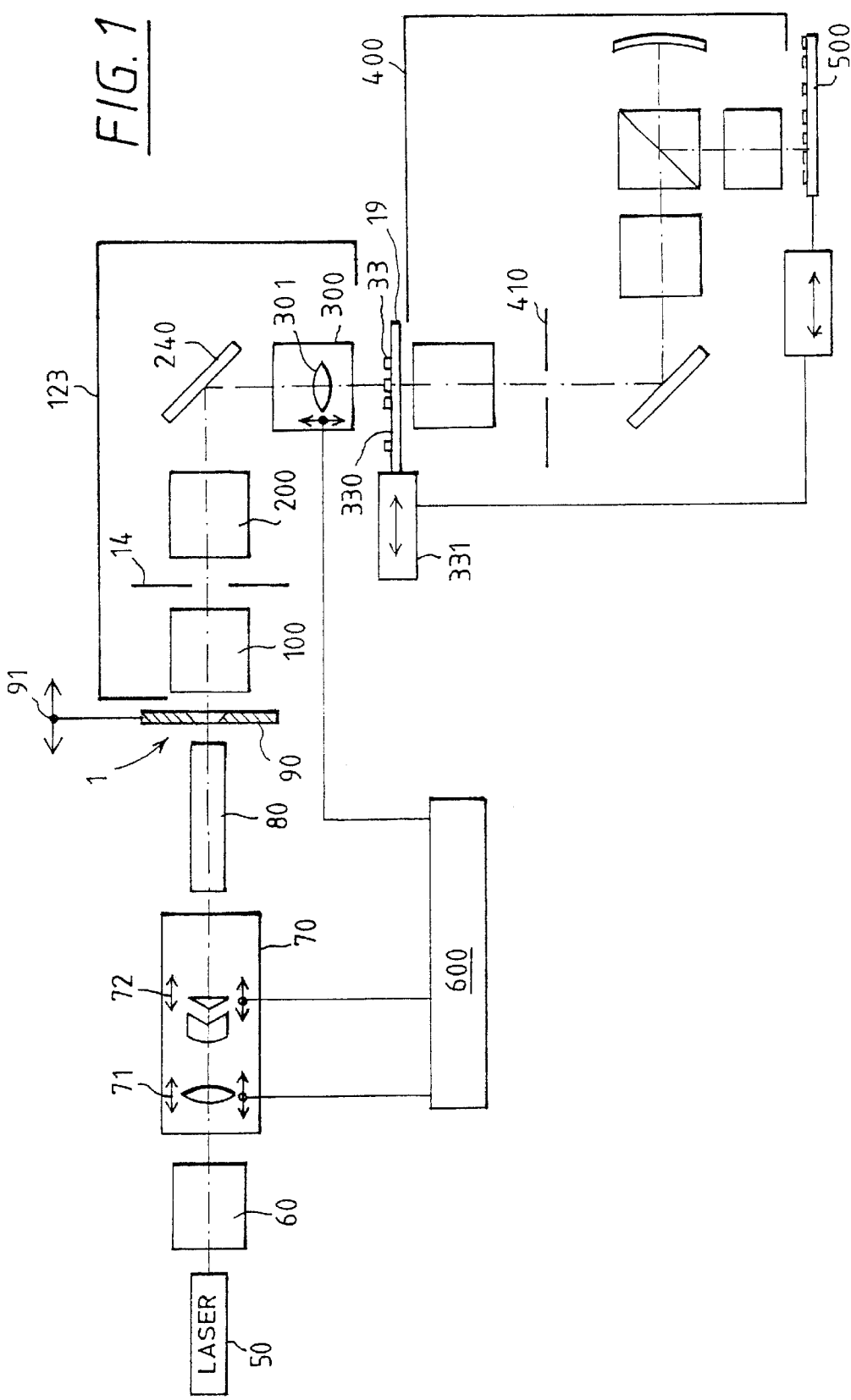
FIG. 1 shows a projection illumination equipment with displaceable lens groups in the REMA objective.

FIG. 1 shows a schematic overview of the optical portion of a whole projection illumination equipment (wafer scanner), in which the REMA objective 123 according to the invention with three lens groups 100, 200, 300 including the displaceable lens group 301 is integrated.

An excimer laser 50 with a wavelength of 248 nm serves as the light source. A device 60 serves for beam formation and coherence reduction. A zoom axicon objective 70 facilitates the setting of various kinds of illumination according to requirements. For this purpose, an adjustable zoom 71 and an adjustable axicon pair 72 are provided. The whole arrangement is known as in German patent application DE 196 53 983 of Carl Zeiss.

The light is coupled into a glass rod 80, which serves for mixing and homogenizing.

A reticle masking system 90 directly adjoins the glass rod 30, and lies in the object plane of the REMA objective 123. This objective consists of a first lens group 100, a pupil plane (diaphragm plane) 14, a second lens group 200, a deflecting mirror 240, a third lens group 300, and an image plane 19. Suitable REMA objectives are known from German Patents DE-A 195 48 805 and DE 196 53 983.

The reticle 330 is arranged in the image plane 19 of the REMA objective 123, and is precisely positioned by the change and adjusting unit 331.

There follows a projection objective 400, which in this embodiment is the catadioptric objective according to WO 95/32446 with a pupil plane 410. A wafer 500, with associated adjusting and movement unit 501, is arranged in the image plane of the projection objective 400.

The following is based on the arrangement being constructed as a scanner, i.e., the reticle 33 and wafer 500 are synchronously moved linearly in the speed ratio of the imaging scale factor of the projection objective 400, and that the illumination system 50–123 produces a narrow slit which is oriented transversely of the direction of motion.

The lens group 301, adjustable according to the invention, is provided in the third lens group 300 of the REMA objective 123, and affects the optical path length by changing an air space. A control unit 600 is connected to the adjustable members 71, 72, 301, and controls these in mutual dependence.

Figure 2:
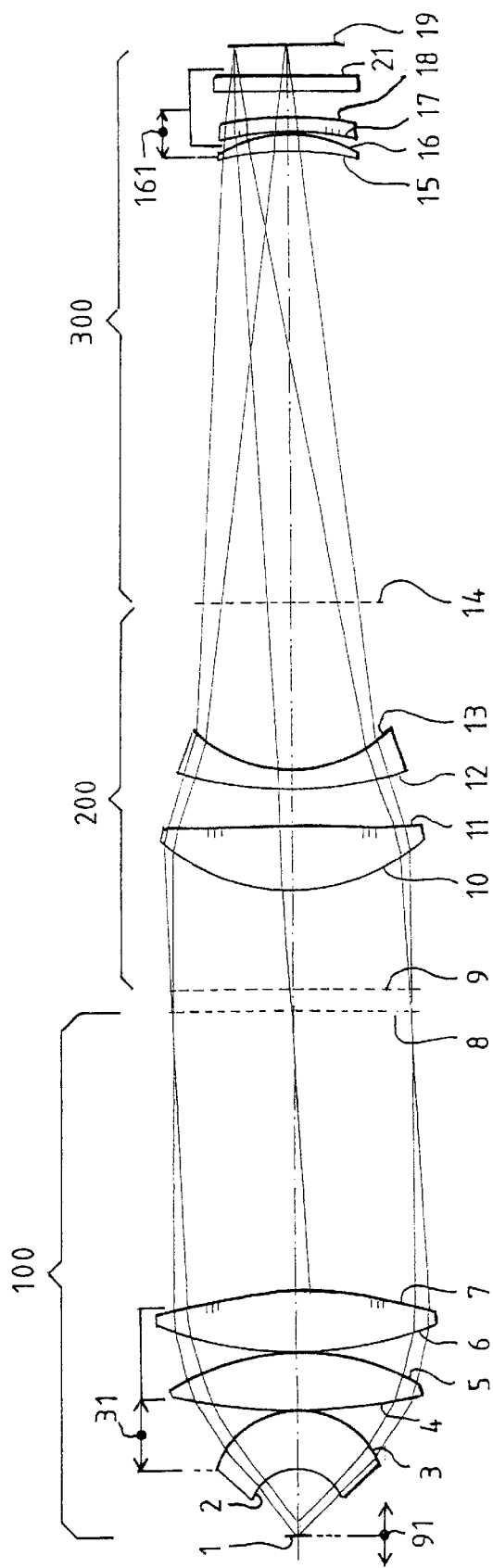
FIG. 2 shows the lens section of a REMA objective with displaceable lens groups.

The REMA objective shown in the lens section of FIG. 2 is a modification of the objective according to FIG. 1 of German Patent DE 196 53 983. The measurements according to Table 1 are taken from Table 1 of the cited document for the surfaces 1 through 19.

However, the air space between surfaces 16 and 17 is axially adjustable with an actuator 161, so that it can be increased (or else reduced) by several millimeters.

The lenses 17, 18 and the gray filter 21 are collectively displaced. The distortion of the REMA objective is thereby increased (reduced), and the intensity distribution in the image plane 19 (at the reticle 33) is increased (reduced) toward the edge. The same effect occurs at the wafer. The conjugate points of the objective 123 remain unchanged.

In the embodiment shown, and in many similar embodiments, there thereby results a worsening of the edge steepness when the REMA system 90 is imaged on the reticle 33. However, this can be compensated, in that either the objective distance is slightly increased by the displacement of the REMA system 9 with an actuator 91, or a further air space of the REMA objective 123 is slightly changed. In the embodiment, this is the air space between the surfaces 3 and 4, and is axially changed with the actuator 31.

It is provided in the example that the air space 16/17 is increased by 2.2 mm, which effects an increase of intensity at the edge of the image field of 0.5%. Associated with this is a broadening of the edge by 0.1 mm and a telecentric impairment by 0.1 mrad.

By shortening the object width ½ by 0.02 mm, the broadening is reduced to only 0.01 mm, with the same telecentric quality. Alternatively or supplementary thereto, the air space ¾ can also be made smaller.

Table 1 gives the design data of this REMA objective for the basic position of the displaceable elements.

The amount of light transported remains constant while the air spaces are varied. If it is considered as an alternative solution that a gray filter is used with a darkening that increases toward the middle, in each case a portion of the light is lost by absorption.

The proposed solution is applied when the intensity distribution in the reticle plane 19 or 33 is to be varied within narrow limits (delta I=±0.5% to 2.0%) without losses, continuously and controllably from the exterior. The uniformity at the wafer is then also correspondingly controllable.

The uniformity correction can then be coupled to the control 600, which e.g. also controls the zoom axicon function.

If the variation path of the air space is further increased, then the worsening of the telecentric effect is no longer tolerable in comparison with the increase in uniformity.

When the deviations of uniformity vary from small apertures to large ring apertures, it is appropriate to combine the displacement of the lens group 301, as a means of correction, with a gray value graduated filter (21 in FIG. 2), which has a radial graduation of transmission corresponding to the average value. For this purpose, the distribution of illumination over the wafer 500 can be evaluated taking account of the whole projection equipment in the specific example.

The displacement according to the invention then still corrects by the average value only the variable components corresponding to the illumination aperture.

TABLE 1

Scale: 4.444:1   Wavelength: 248.33 nm

| | Radius | Thickness | Material |
|---|---|---|---|
| 1 | | 55.240 | |
| 2 | −38.258 | 46.424 | Quartz |
| 3 | −66.551 | 0.633 | |
| 4 | 881.696 | 45.341 | Quartz |
| 5 | −190.791 | 0.924 | |
| 6 | 374.111 | 47.958 | Quartz |
| 7 | −287.518 | 222.221 | |
| 8 | diaphragm | 17.900 | |
| 9 | ∞ | 79.903 | |
| 10 | 164.908 | 52.530 | Quartz |
| 11 | −1246.141 | 27.586 | |
| 12 | 280.226 | 19.580 | Quartz |
| 13 | 114.495 | 133.941 | |
| 14 | ∞ | 365.253 | |
| 15 | −216.480 | 12.551 | Quartz |
| 16 | −113.446 | 1.399 | |
| 17 | −329.0.56 | 10.797 | Quartz |
| 18 | −552.687 | 60.000 | |
| 19 | ∞ | 0.000 | |

| Surface | | Aspheric Constants | |
|---|---|---|---|
| 7 | K = −0.00640071 | C1 = 0.347156E−07 | C2 = 0.802432-E−13 |
| | C3 = −0.769512E−17 | C4 = 0.157667E−21 | |
| 11 | K = +0.00104108 | C1 = 0.431697E−07 | C2 = −0.564977-E−13 |
| | C3 = −0.125201E−16 | C4 = 0.486357E−21 | |
| 17 | K = +0/00121471 | C1 = −0.991033E−07 | C2 = −0.130790-E−11 |
| | C3 = −0.414621E−14 | C4 = 0.200482E−17 | C5 = −0.392671-E−21 |

We claim:

1. An illumination system for microlithographic projection equipment comprising in the listed sequence a light source, a first plurality of optical elements, a reticle masking system, a second plurality of optical elements defining a first lens group, a pupil plane, a third plurality of optical element defining a second lens group, a fourth plurality of optical elements defining a third lens group, a reticle plane, wherein said first plurality of optical elements collects light of said light source and illuminates said reticle masking system, wherein said first second and third lens group and said pupil plane define a REMA objective, wherein said REMA objective forms an image of said reticle masking system on said reticle plane, wherein said image has a distortion, and wherein a first optical path between two of said optical elements of said third lens group is adjustable to adjust said distortion.

2. The illumination system according to claim 1, wherein said image has a light intensity distribution with a uniformity and wherein said uniformity is varied by adjusting said distortion.

3. The illumination system according to claim 2, wherein said light intensity distribution is increased or reduced toward an edge of said image by adjusting said distortion.

4. The illumination system according to claim 1, wherein said REMA objective comprise lenses.

5. The illumination system according to claim 1, wherein said first optical path is adjustable by continuous displacement.

6. The illumination system according to claim 5, wherein said first optical path is displaceable by several millimeters.

7. The illumination system according to claim 1, wherein said image has an edge steepness and wherein second optical path between two of said optical elements of said first lens group is adjustable to compensate a worsening of said edge steepness while adjusting said distortion.

8. The illumination system according to claim 7, wherein said image has a light intensity distribution that is increased or reduced toward an edge of said image by adjusting said distortion, and wherein said edge steepness is worsened by less than 0.1 mm while said light intensity distribution is increased toward said edge of said image by 0.5%.

9. An illumination system for microlithographic projection equipment comprising in the listed sequence a light source, a first plurality of optical elements, a reticle masking system, a second plurality of optical elements a reticle plane, wherein said first plurality of optical elements collects light of said light source and illuminates said reticle masking system, wherein said second plurality of optical elements define a REMA objective, wherein said REMA objective forms an image of said reticle masking system on said reticle plane, wherein said image has an aperture and wherein said aperture is changed in kind or in magnitude, by adjusting, changing or exchanging one or more optical elements of said first plurality of optical elements, and wherein said image has a distortion and wherein said distortion is adjusted by adjusting a first variable optical path between two of said optical elements of said second plurality of optical elements, and wherein said distortion is adjusted in dependence on said aperture.

10. The illumination system according to claims 9, wherein said image has a light intensity distribution and wherein said light intensity distribution is increased or reduced toward an edge of said image by adjusting said first variable optical path.

11. The illumination system according to claim 9, wherein said first variable optical path is adjustable by continuous displacement.

12. The illumination system according to claim 9, wherein said first plurality of lenses comprises a zoom axicon objective with an adjustable zoom and an adjustable axicon.

13. The illumination system according to claim 12, wherein said aperture is changed is kind by adjusting said axicon and is changed in magnitude by adjusting said zoom.

14. The illumination system according to claim 13, wherein said distortion and said aperture is adjusted by continuous displacement of optical elements in said zoom axicon objective and in said REMA objective.

15. The illumination system according to claim 9, wherein said first plurality of optical elements comprises further an homogenizing rod and wherein said reticle masking system directly adjoins said homogenizing rod.

16. A microlithographic projection equipment comprising in the listed sequence a light source, a first plurality of optical elements comprising a zoom axicon objective with an adjustable zoom and an adjustable axicon, a homogenizing rod, a reticle masking system directly adjoining said homogenizing rod, a second plurality of optical elements defining a first lens group, a pupil plane, a third plurality of optical elements defining a second lens group, a fourth plurality of optical elements defining a third lens group a reticle, a projection objective, and a wafer, wherein said first plurality of optical elements collects light of said light source and illuminates said homogenizing rod, wherein said first, second and third lens group and said pupil plane define a REMA objective, wherein said REMA objective forms a first image of said reticle masking system on said reticle plane, wherein said projection objective forms a second image of said reticle on said wafer, wherein said first image has a distortion and wherein a first optical path between two of said optical elements of said third lens group is continuously adjustable to adjust said distortion and wherein said first image has an aperture of illumination and wherein said aperture is changed in kind or in magnitude by adjusting said axicon or said zoom, and wherein said distortion is adjusted in dependence on said aperture.

17. The microlithographic projection equipment according to claim 16, wherein a second optical path between two of said optical elements of said first lens group is adjustable to compensate for a worsening of said edge steepness while adjusting said distortion.

18. The microlithographic projection equipment according to claim 16, wherein said third lens group comprises a gray value graduated filter.

19. A process for operation of a microlithographic projection equipment with a light source, a first plurality of optical elements, a reticle masking system, a second plurality of optical elements, a reticle plane, wherein said first plurality of optical elements collects light of said light source and illuminates said reticle masking system, wherein said second plurality of optical elements define a REMA objective, wherein said REMA objective forms an image of said reticle masking system on said reticle plane wherein said image has a distortion, an aperture of illumination, a light intensity distribution and an edge steepness, wherein the process comprises adjusting said aperture in kind or in magnitude by adjusting, changing or exchanging one or more of said optical elements of said first plurality of optical elements, and adjusting said distortion by varying a first variable optical path between two of said optical elements of said REMA objective in dependence on said aperture.

20. The process according to claim 19, comprising increasing or reducing said light distribution toward the edge of said first image by adjusting said distortion.

21. The process according to claim 19, comprising varying said first optical path by continuously displacing at least one of said optical elements of said REMA objective.

22. The process according to claim 19, comprising adjusting said aperture in kind or in magnitude by adjusting an adjustable axicon or an adjustable zoom being arranged in said first plurality of lenses.

23. The process according to claim 19, comprising compensating for worsening of said edge steepness while adjusting said distortion by varying a second optical path in said REMA objective.

24. The process according to claim 19, comprising controlling said adjusting of said distortion and of said aperture with a control unit.

* * * * *